us005548548A

United States Patent [19]
Chatterjee et al.

[11] Patent Number: 5,548,548
[45] Date of Patent: Aug. 20, 1996

[54] PASS TRANSISTOR FOR A 256 MEGABIT DRAM WITH NEGATIVELY BIASED SUBSTRATE

[75] Inventors: Amitava Chatterjee, Plano; Jiann Liu, Irving; Purnendu Mozumder, Plano; Mark S. Rodder, University Park; Ih-Chin Chen, Richardson, all of Tex.

[73] Assignee: Texas Instruments Incorporated, Dallas, Tex.

[21] Appl. No.: 358,647

[22] Filed: Dec. 19, 1994

Related U.S. Application Data

[63] Continuation of Ser. No. 215,241, Mar. 21, 1994, abandoned.

[51] Int. Cl.$^6$ ............................................. G11C 11/401
[52] U.S. Cl. .................. 365/149; 365/182; 365/189.09; 257/327
[58] Field of Search .................................. 365/149, 182, 365/189.09; 257/327, 901, 347

[56] References Cited

U.S. PATENT DOCUMENTS

| | | | |
|---|---|---|---|
| 5,274,586 | 12/1993 | Matsukawa | 365/149 |
| 5,309,386 | 5/1994 | Yusuki et al. | 365/149 |
| 5,323,343 | 6/1994 | Ogoh et al. | 365/149 |

OTHER PUBLICATIONS

R. Dennard et al., "1μm Mosfet VLSI. . . Applications," IEEE J. of S.-S. CKTS, vol. Sc-14, #2, Apr. 1979, pp. 247–255.

M. Konaka et al., "Suppression of Anomalous Organ Current in Short Chan. Mosfet," Jap. J.A.P., vol. 18, 1979, Supl. 16–1, pp. 27–33.

B. Hoeneisen et al., "Fundamental Limitations in Microelectronics-I. Mos Tech.," Solid-State Electronics, 1972, vol. 15, pp. 819–829.

Kawakara et al., *Subthreshold Current Reduction for Decoded-Driver by Self-Reverse Biasing*, IEEE Journal of Solid-State Circuits, vol. 28, No. 11, Nov. 1993, pp. 1136–1143.

Rodder et al., *Oxide Thickness Dependence of Inverter Delay and Device Reliability for 0.25μm CMOS Technology*, IEDM 93, pp. 879–882.

*Primary Examiner*—Joseph E. Clawson, Jr.
*Attorney, Agent, or Firm*—Lawrence J. Bassuk; Leo N. Heiting; Richard L. Donaldson

[57] ABSTRACT

A design to attain a pass transistor for a 256 Mbit DRAM part. The transistor having a gate length of about 0.3 μm, a $t_{ox}$ of about 85 Å, which is much thicker than the ~65 Å $t_{ox}$ for 0.25 μm logic technology, a $V_{WL}$ of 3.75 V, a $V_{sub}$ of –1 V, arsenic LDD and a boron concentration in the channel region of about $2.7 \times 10^{17}$ /cm$^3$ are the desired technological choices for 256 Mbit DRAM devices.

13 Claims, 4 Drawing Sheets

PASS TRANSISTOR FOR A 256 MEGABIT DRAM WITH NEGATIVELY BIASED SUBSTRATE

This application Continuation of application Ser. No. 08/215,241 filed Mar. 21, 1994.

FIELD OF THE INVENTION

This invention relates generally to pass transistors used in the cells of dynamic random access memory (DRAM) devices and particularly relates to the parameters of pass transistors used in 256 Megabit DRAM devices.

DESCRIPTION OF THE RELATED ART

Leading edge design rules for process, device and manufacturing technologies make DRAMs the technology driver. Although the technological challenges are manifold: lithography, storage capacitor and isolation, to name a few, a robust pass transistor design is equally important to a successful one transistor cell DRAM. The maximum stored or charged voltage $V_{ch}$ that a pass transistor can write to the capacitor determines the important storage charge of the cell, while the off-state leakage current $I_{off}$ through the pass transistor, among other leakages, determines the important data retention time. Circuit techniques to reduce subthreshold leakage in DRAMs are being explored. See T. Kawahara et al, Subthreshold Current Reduction for Decoded-Driver by Self-Reverse Biasing, *IEEE JSSC*, Vol. 28, No. 11, November 1993, pp. 1136–43, incorporated herein by reference, but such approaches are not yet established for the pass transistor.

The design considerations for a DRAM pass transistor differ from those for a high performance transistor for logic. The design objective of maximizing the performance figure-of-merit for logic transistors, see M. Rodder et al, Oxide Thickness Dependence of Inverter Delay and Device Reliability for 0.25 u*m CMOS Technology, *IEDM Tech. Dig.*, 1993, pp. 879–882, incorporated herein by reference, is not relevant for the DRAM pass transistor design.

Increasing or reducing the values of the design variables have gains and penalties specific to pass transistor designs. For example, increasing the substrate concentration has the desirable effect of reducing subthreshold leakage, but, on the other hand, has the undesirable effect of increasing the body-effect, which, in turn, reduces the stored charge or the voltage $V_{ch}$ to Which the cell is charged. Likewise, reducing the oxide thickness has the desirable effect of reducing the rolloff in threshold voltage $V_t$ at short gate lengths and thereby reducing $I_{off}$, but the undesirable effect is that the booted wordline voltage has to be reduced to maintain reliability of the thinner oxide. The reduced wordline voltage results in a lower $V_{ch}$.

Also, unlike logic devices, DRAMs use a substrate bias. A substrate back bias, as opposed to a zero substrate bias, can also have conflicting effects on the pass transistor design. On one hand, the subthreshold slope will improve which tends to reduce $I_{off}$; on the other hand, the $V_t$ rolloff gets worse. Due to these conflicting restraints, choosing the optimum conditions for oxide thickness $t_{ox}$, wordline voltage $V_{WL}$, substrate voltage $V_{sub}$ and channel concentration is a non-trivial device design issue.

Further, all of the extremely large number of pass transistors ($2^{28}$ or 268,435,456 for a 256M DRAM part) must be within specification for the chip to be completely functional and to pass quality and reliability standards. As the gate length L is scaled, both $I_{off}$ and $V_{ch}$ influence a novel design optimization aimed at maximizing the probability that all the transistors are within specification despite statistical variations in the gate length L.

SUMMARY OF THE INVENTION

The present invention achieves a pass transistor for a single cell dynamic random access memory device or part that facilitates fabrication of over 256 million bits of information on a single chip of silicon semiconductor. The design variables for pass transistor design are defined by a combination of lengths, thicknesses, voltages and implanted impurity concentrations in the silicon. These parameters and their ranges distinctly describe the desired pass transistor.

The claimed invention thus encompasses a dynamic random access memory formed in a semiconductor substrate with a plurality of one transistor cells. The pass transistor has source and drain implant regions on either side of a channel region in the substrate and a gate overlying and separated from the channel region by a dielectric layer. The pass transistor comprises a patterned gate length L of about 0.3 μm, a dielectric thickness of about 85 Å, the source and drain being lightly doped with arsenic, the gate carrying a wordline voltage of about 3.75 volts, the substrate being biased at about −1 volts, and the substrate being doped with a boron concentration in the channel region of about $2.7 \times 10^{17}/cm^3$.

The range of values for these parameters can be obtained additionally for pass transistors having a gate length L=0.25 μm by providing a boron pocket implant near the source and drain regions.

BRIEF DESCRIPTION OF THE DRAWING FIGURE

Figure 8:
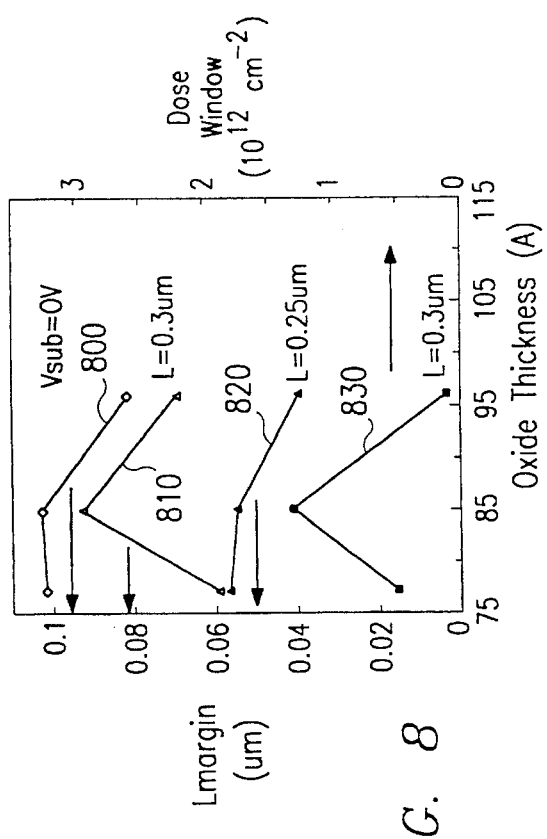
Figure 10:
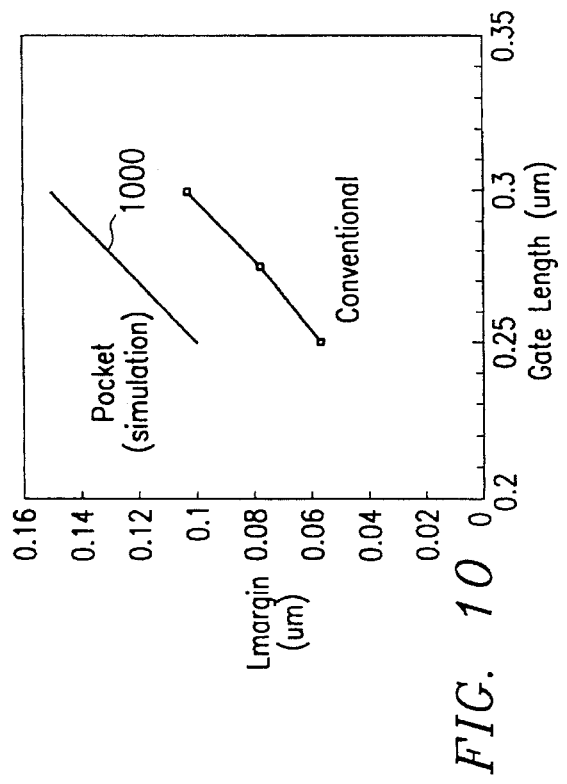
Figure 12:
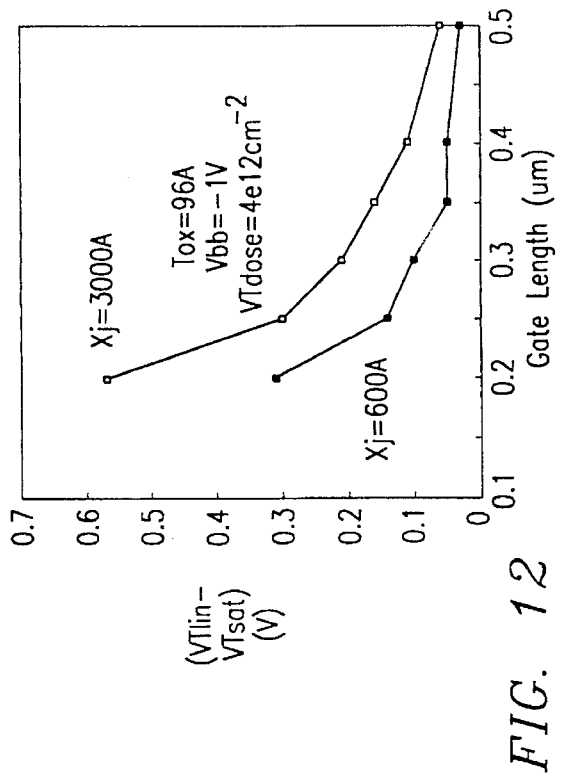
Figure 9:
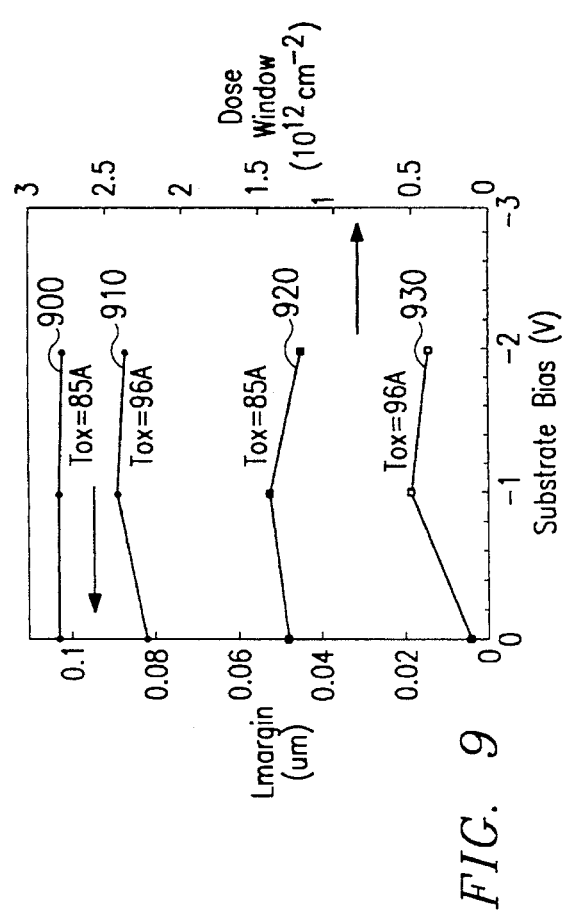
Figure 11:
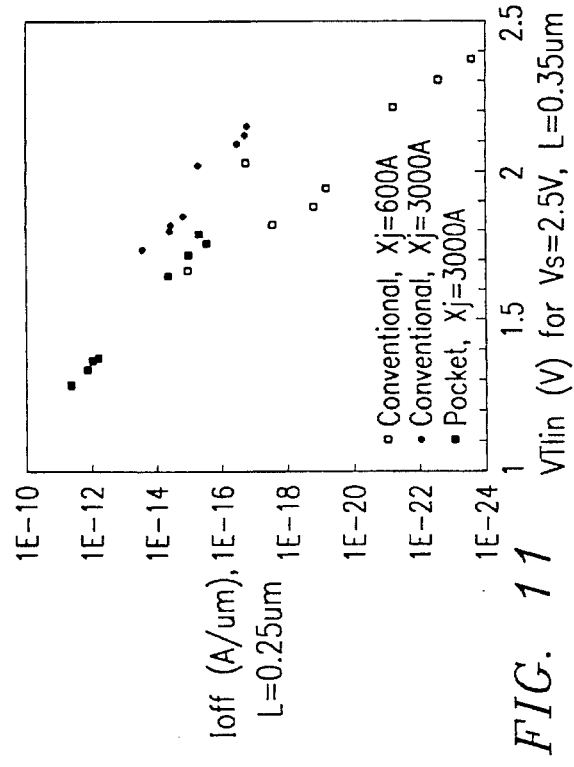
Figure 13:
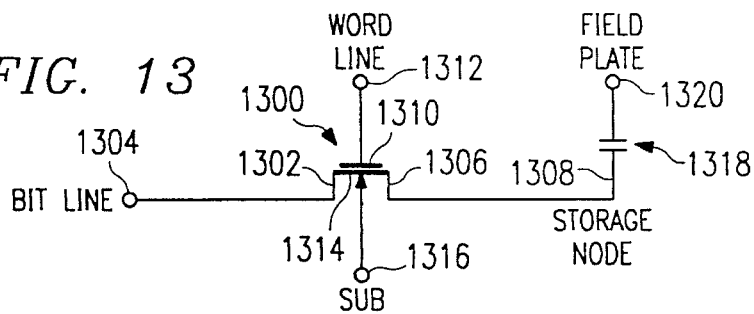
Figure 14:
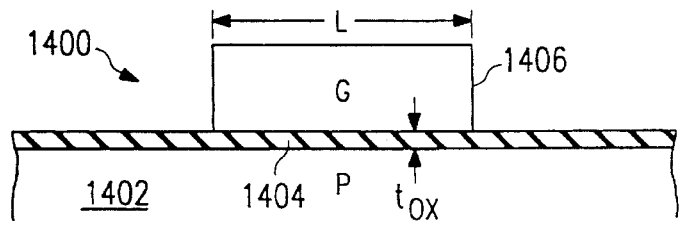
Figure 15:
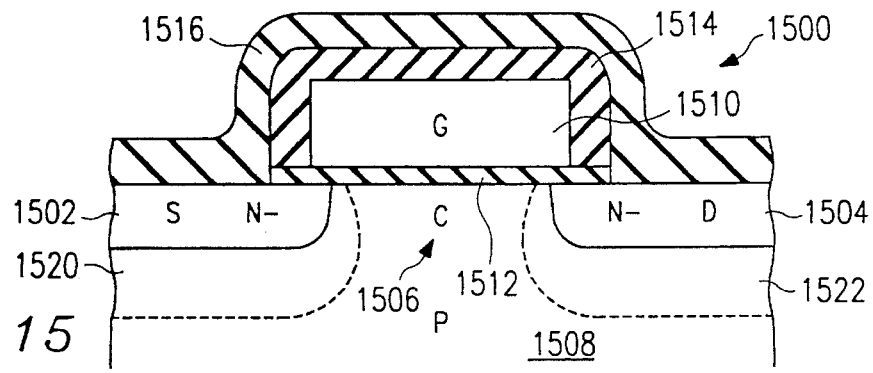
Figure 16:
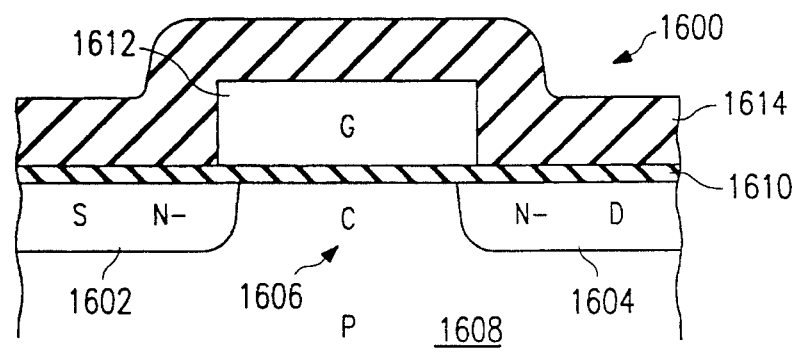
Figure 17:
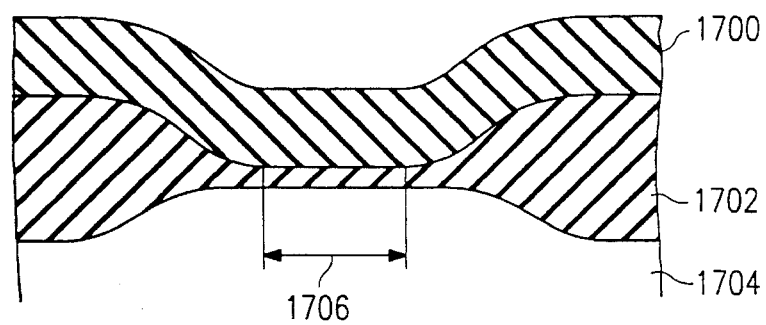

FIG. 8 is a graph of peak $L_{margin}$ vs $t_{ox}$ for L=0.3 μm and 0.25 μm. The lower L=0.3 μm line is when $V_{ch}$>0.85 $V_{cc}$. The bottom curve plots $D_W$ vs $t_{ox}$ for L=0.3 μm;

FIG. 9 is a graph of peak $L_{margin}$ and $D_W$ vs $V_{sub}$ for L=0.3 μm and $t_{ox}$ of 85 Å and 96 Å, with the top curves plotted to $L_{margin}$ and the bottom two curves plotted to $D_W$;

FIG. 10 is a graph of $L_{margin}$ VS target L for a conventional As LDD (experimental) and pocket implant (simulation). $V_{sub}$=−1 V;

FIG. 11 is a graph of $I_{off}$ vs $V_{Tlin}$ for two conventional transistors and one pocket implant transistor $t_{ox}$=96 Å;

FIG. 12 is a graph of $V_{Tlin}$-$V_{sat}$ vs gate length for a shallow S/D (N+masked away from gate) and a deep S/D (n+after sidewall oxide);

FIG. 13 is a schematic representation of a one transistor storage cell used in a DRAM memory device;

FIG. 14 is a cross-sectional view of an intermediate stage of fabricating a pass transistor used in the storage cell of FIG. 13 depicting a patterned gate formed over gate oxide on a substrate;

FIG. 15 is a cross-sectional view of a completed pass transistor used in the storage cell of FIG. 13 formed using one process and used to obtain the experimental data presented in this patent;

FIG. 16 is a cross-sectional view of another embodiment of a pass transistor used in the storage cell of FIG. 13 formed in a more conventional manufacturing process;

FIG. 17 is a cross-sectional view of a pass transistor represented in FIG. 13 in a plane normal to the cross-sections depicted in FIGS. 14–16.

DETAILED DESCRIPTION

Sample pass transistors were fabricated on (100) oriented p-type wafers with 10–15 Ω-cm. After standard well formation and LOCOS isolation, threshold voltage $V_T$ adjust implant with boron B, 20 Kev, with $V_T$-dose ranging from $3 \times 10^{12}$ cm$^{-2}$ to $8 \times 10^{12}$ cm$^{-2}$ was done. Gate oxides ranging from 77 Å to 103 Å were grown. LDD implants were As or P, $4 \times 10^{13}$ cm$^{-2}$. Most of the wafers are with LDD S/D implant only. The S/D anneal occurs at 900° C. for 20 minutes, followed by metalization and sintering in forming gas at 450° C for 30 minutes.

Figure 1:
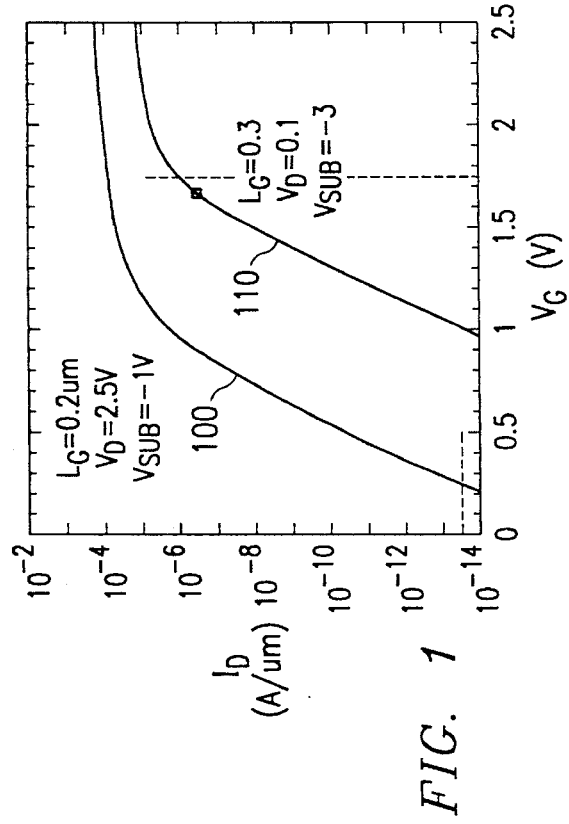
FIG. 1 is a graph of two transistor I-V curves.

In FIG. 1, typical leakage characteristics occur along curve 100 for a gate length L=0.2 μm, $V_D$=2.5 V and $V_{sub}$=−1 V, and typical $V_T$ characteristics occur along curve 110 for a gate length L=0.3 μm, $V_D$=0.1 V and $V_{sub}$=−3 V. Both leakage specifications at L=0.2 μm and $V_T$ specifications at L=0.3 μm are met.

Among the pass transistor design constraints, subthreshold leakage ($I_{off}$<$3 \times 10^{-14}$A/ μm) and charging voltage ($V_{ch}$>0.8 $V_{cc}$) are typically the most stringent requirements. Since the storage node voltage is effectively an additional substrate bias to the pass transistor, $V_{ch}$ is equal to $V_{WL}$−$V_{Tsp}$, where $V_{Tsp}$ is the $V_T$ at substrate bias of $V_{sub}$−$V_{ch}$.

Figure 2:
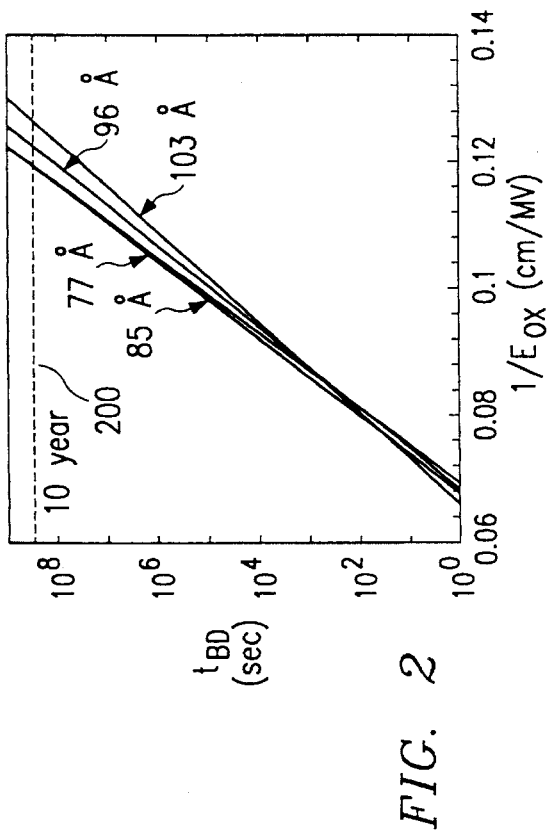
FIG. 2 is a graph of time-to-breakdown, $t_{BD}$, VS $1/E_{ox}$, the inverse of the electric field in the oxide, for $t_{ox}$=77 Å, 85 Å, 96 Å and 103 Å.

FIG. 2 presents the results of time-dependent dielectric-breakdown TDDB tests done to locate $E_{ox}$ (intrinsic) for 10-year time-to-breakdown; this is used to obtain the applicable wordline voltage $V_{WL}$ for various oxide thicknesses $t_{ox}$. The intrinsic $E_{ox}$ occurs at dashed line 200, which represents 10 years in time.

Figure 3:
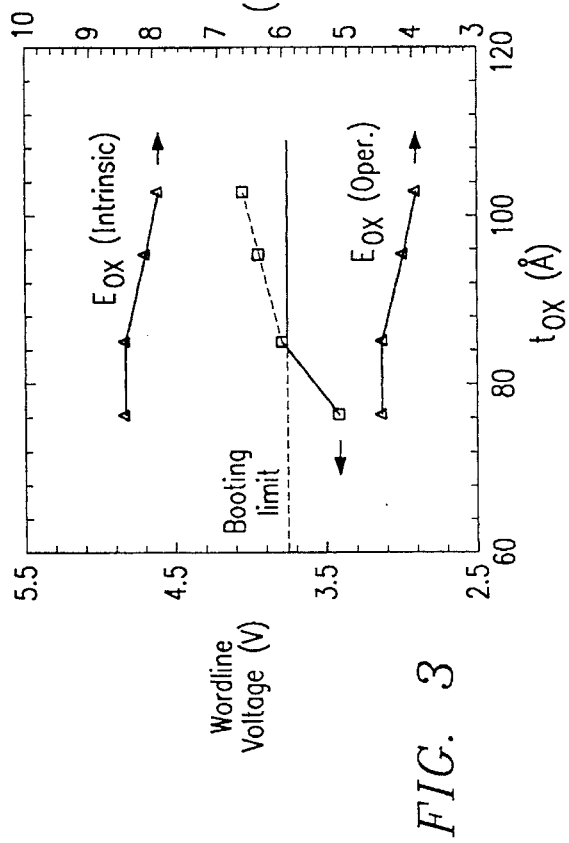
FIG. 3 is a graph of intrinsic $E_{ox}$ for $t_{BD}$=10 year, operating $E_{ox}$, and $V_{WL}$ VS $t_{ox}$.

FIG. 3 illustrates that the wordline voltage VwL is then selected to be the smaller of: $t_{ox}$ times operation $E_{ox}$, which is 4 MV/cm less than that of the 10-year lifetime, or 1.5 times $V_{cc}$=3.75 V which is the practical limit for the booting circuit. Other pass transistor design constraints, that is to say, source-drain punch-through voltage (BVDSS) and gate-induced drain leakage (GIDL), turn out to be less stringent. The measured BVDSS at L=0.2 μm are >5 V for all devices that satisfy the $I_{off}$ constraint.

Figure 4:
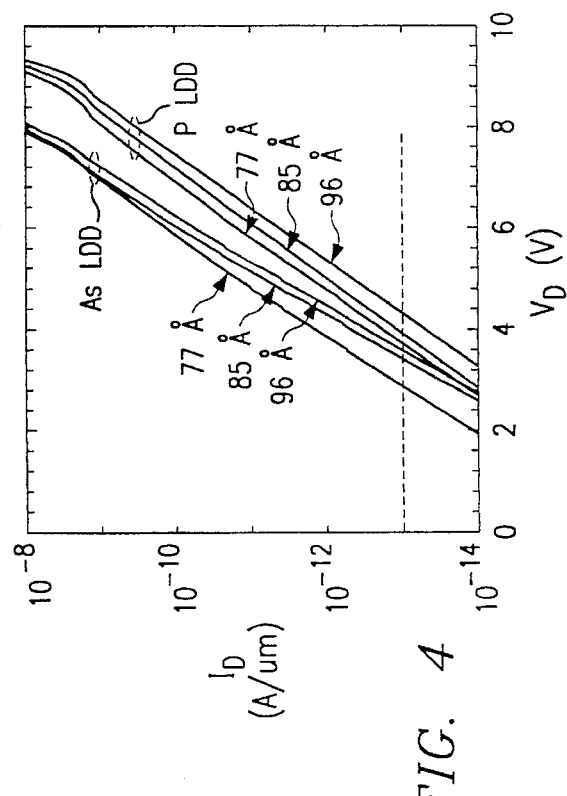
FIG. 4 is a graph of drain current vs drain voltage indicating gate-induced drain leakage GIDL at 300K for both arsenic As lightly doped drains LDD and phosphorous P LDD at $t_{ox}$=77 Å, 85 Å and 96 Å.

FIG. 4 depicts that the gate-induced drain leakage GIDL depends on to and LDD species: As or P.

Figure 5:
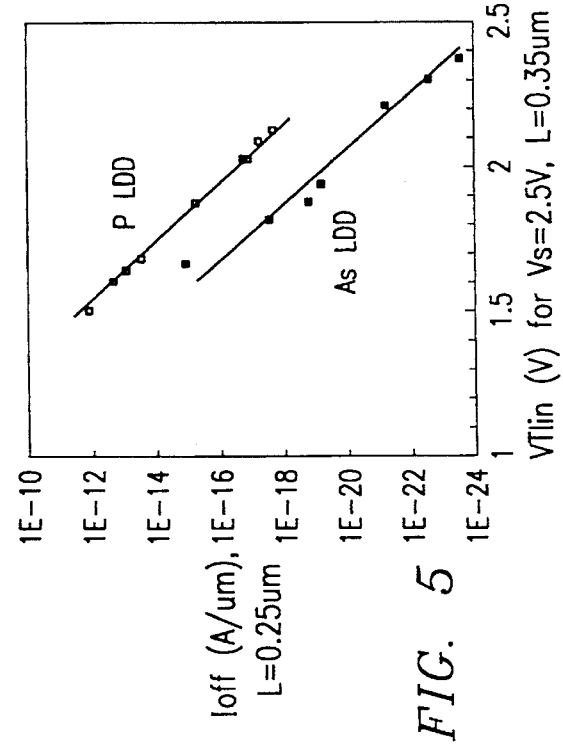
FIG. 5 is a graph of $I_{off}$ VS $V_{Tlin}$ for phosphorous and arsenic LDD at $t_{ox}$=96 Å.

FIG. 5 depicts that, despite the higher GIDL currents indicated in FIG. 4, an arsenic LDD provides a better tradeoff between short-channel and body effects than phosphorous LDD. Arsenic and phosphorous are N-type dopants.

In FIG. 5, $I_{off}$ at L=0.25 μm for arsenic is clearly lower than phosphorous at a given $V_{Tsp}$ at L=0.35 μm. Thus we choose arsenic as the LDD species.

Optimizing $t_{ox}$, $V_{sub}$, and $V_T$-dose for a target L occurs as follows. For each pair of $t_{ox}$ and $V_{sub}$, the values for $V_{ch}$ and $I_{off}$ are determined on a dense grid of $V_T$-dose and L by interpolation and extrapolation from experimental data with the aid of tuned device simulations. The constraints on $I_{off}$ and $V_{ch}$ define an "acceptable" region.

Figure 6:
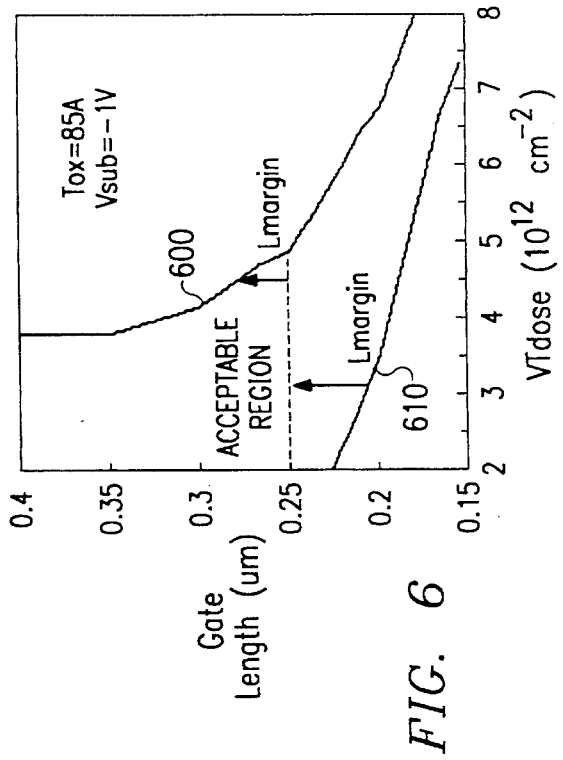
FIG. 6 is a graph of gate length L vs $V_T$-dose with vertical arrows marking $L_{margin}$ at $V_T$-doses of $3 \times 10^{12}$ and $4.5 \times 10^{12}$ for a target L=0.25 μm.

In FIG. 6, the area between the two curves 600 and 610 defines an example of such an acceptable region for $t_{ox}$=85 Å and $V_{sub}$=−1 V. The upper bound of the region is determined by the constraints on $V_{ch}$, while the lower bound is due to the constraints on $I_{off}$. Let us define a primary metric $L_{margin}$ of a given design to be the margin in gate length L (vertical distance in FIG. 6) from the nearest boundary curve 600 or 610. The yield of a given design is higher if $L_{margin}$ is larger.

Figure 7:
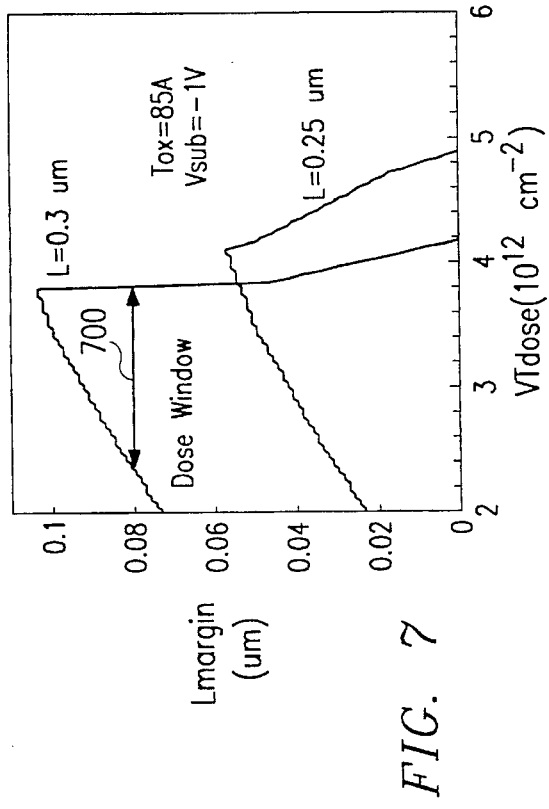
FIG. 7 is a graph of $L_{margin}$ VS $V_{T\text{-}dose}$ for a target L=0.3 μm. Here $t_{ox}$=85 Å and $V_{sub}$=−1 V.

FIG. 7 shows the $L_{margin}$ vs. $V_T$-dose corresponding to FIG. 6. To ensure that all the $2^{28}$ transistors in a 256 Mbit DRAM are within specification, $L_{margin}$ needs to be >0.08 μm. Arrow 700 indicates the range in $V_T$-dose for which $L_{margin} \geq 0.08$ μm. A secondary metric, dose window $D_W$, defined as the range of $V_T$-dose at which $L_{margin} \geq 0.08$ μm in FIG. 7, is a measure of the sensitivity of the DRAM yield to variations in $V_T$-dose.

FIG. 8 plots $L_{margin}$ and $D_W$ for $t_{ox}$ ranging from 77 Å to 96 Å. Curves 800, 810 and 820 are plotted to the $L_{margin}$ axis and curve 830 is plotted to the dose window axis. Curves 800 and 810 are for L=0.3 μm and curve 820 is for L=0.25 μm. Clearly $L_{margin}$ is smaller at 96 Å for the curves 800, 801 and 820 because $V_{WL}$ is limited to 1.5×$V_{cc}$. Although at the 77 Å to 85 Å range $L_{margin}$ for curves 800 and 820 is relatively flat, curve 830 for $D_W$ clearly shows that 85 Å is better than 77 Å. Curve 810, obtained using $V_{ch}$>0.85×$V_{cc}$, also demonstrates that 85 Å is optimum.

FIG. 9 plots a similar evaluation for $V_{sub}$. Curves 900 and 910 plot to the $L_{margin}$ axis and curves 920 and 930 plot to the $D_W$ axis. Again, for the 85 Å case, $L_{margin}$ is relatively constant, but curve 920 clearly indicates that $V_{sub}$=1 V is an optimum choice.

This optimum choice depends on the specific constraints used here, such as $V_{ch}$>0.8 $V_{cc}$, booting limit of 1.5 $V_{cc}$, $V_{cc}$=2.5 V, operating $E_{ox}$ of 4 MV/cm less than that for 10 year lifetime, $I_{off}$<$3 \times 10^{-14}$ A/cm and $L_{margin} \geq 0.08$ μm.

While these are reasonable constraints, the constraints may be relaxed or tightened depending on the requirements and capability of future technology. For example, if stepper technology improves then $L_{margin} \geq 0.08$ μm may be relaxed to say $L_{margin}$0.05 μm. Likewise, if sense amplifier sensitivity improves then a lower $V_{ch}$ may be tolerated. However, we have delineated by example a design methodology that can be applied to the new constraints to arrive at an optimum choice consistent with the new constraints.

As for scaled design at L=0.25 μm, an immediate limitation is that $L_{margin}$<0.08 μm, see FIG. 7. Our simulation studies show that $L_{margin}$ can be improved by using a pocket implant, as indicated by the pocket curve 1000 in FIG. 10.

Additional pass transistor samples were prepared with the previously stated values and a pocket implant of boron implanted at an angle of zero degrees. Boron is a P-type dopant.

In FIG. 11, initial experimental results indicate that a pocket counter dopant implant of boron at 0 degrees angle in a pass transistor with regular S/D junctions performs better than the transistors with only regular S/D junctions. These data support the conclusion that boron pocket implants with a shallow S/D junction should provide the large design margin indicated in FIG. 10. Using the boron counter dopant or pocket implant may be necessary to obtain a useful product when scaling the target gate length from 0.3 μm to 0.25 μm. The pocket implant will eliminate or reduce the boron $V_t$ adjust implant dose.

The graph of FIG. 12 demonstrates that a shallow S/D junction depth of $X_j$=600 Å reduces the drain-induced barrier lowering $V_{Tlin}$-$V_{Tsat}$ compared to a deep S/D junction.

In FIG. 13, pass transistor 1300 has a source/drain 1302 connected to bitline 1304 and a source/drain 1306 connected to storage node 1308. Gate 1310 of transistor 1300 connects to wordline 1312 and channel 1314 of transistor 1300 connects to or is formed in substrate 1316. Storage node 1308 is formed on one side of capacitor 1318 with the other side of the capacitor being formed by a field plate 1320.

In FIG. 14, transistor 1400 is in an intermediate step or stage of fabrication. The substrate P-type material 1402 carries a gate oxide 1404 having a thickness of $t_{ox}$. The gate oxide 1404 in turn carries a polysilicon gate material 1406. The gate material 1406 extends over the array of memory cells to form one of the wordlines. The gate 1404 has a dimension L resulting from patterning a layer of polysilicon material formed over the gate oxide. The dimension L is the gate length referred to in this patent. This stage of processing occurs before formation of an oxide over the gate, which consumes some of the polysilicon gate material and reduces the polysilicon gate length by about 10 percent.

In FIG. 15, a completed transistor 1500 represents the transistor used to obtain the experimental data in this patent. Transistor 1500 comprises N⁻-type source and drain regions 1502 and 1504 and channel region 1506 formed in P-type substrate 1508. Gate 1510 and gate oxide 1512 extend over the channel region 1506 and overlap the source and drain regions 1502 and 1504. Gate 1510 overlaps the source and drain regions by about 200 Å optimally. During processing and after patterning of the gate 1510 on oxide layer 1512, a second oxide layer 1514 is formed over the gate. The gate oxide 1512 and the second oxide 1514 are patterned to their final depicted shape, and a third oxide 1516 is formed over the existing structures. Then an arsenic or phosphorus implant is done to obtain the source and drain regions 1502 and 1504.

To obtain the pocket implant experimental data represented in FIGS. 11 and 12, some of the sample transistors were processed differently before application of the full thickness of oxide layer 1514. The gate oxide 1512, the polysilicon gate 1510 and a part of oxide 1514 were formed on the substrate 1508. A pocket implant of boron was performed to effect halos or pockets 1520 and 1522, represented by dashed lines, near the respective source and drain regions 1502 and 1504. This implant occurred at an implant angle of zero degrees; other implant angles could be used as desired.

In FIG. 16, transistor 1600 represents a more conventional structure. Source and drain regions 1602 and 1604, formed of N⁻-type material, and channel 1606 are formed in P-type substrate material 1608. Gate oxide 1610 overlays the substrate 1608 and carries gate 1612. Gate 1612 extends over at least part of the source and drain regions 1602 and 1604. A layer of oxide 1614 overlays all the existing structures.

In FIG. 17, a polysilicon wordline 1700 extends over oxide 1702 and substrate 1704. Dimension 1706 indicates a dimension of the gates of transistors 1400, 1500 and 1600 normal to the gate length L depicted in elevation in FIGS. 14, 15 and 16. The experimental data described in this application came from transistors having a dimension 1706 of about 10 μm. This dimension will be about 0.3 μm in the DRAM array. As a result of this, some of the transistor characteristics may be slightly different causing the optimum design to shift accordingly.

The transistors 1400, 1500 and 1600 all can be formed with the parameters of channel length L=0.3 μm, oxide thickness $t_{ox}$=85 Å, wordline voltage $V_{WL}$=3.75 volts, substrate bias voltage $V_{sub}$=-1 volt, arsenic LDD and a substrate doped with boron in the channel region to a concentration of about $2.7 \times 10^{17}/cm^3$ as the optimum technological choices to obtain a workable transistor for the 256 Megabit DRAM.

The desired parameters and their ranges occur as follows: Gate length L: 0.3 μm±0.08 μm Gate oxide thickness: 85 Å±5 Å Boron $V_t$ adjust: $3.5 \times 10^{12}/cm^2 \pm 2 \times 10^{12}/cm^2$, 20 Kev±2 Kev* Arsenic: $4.0 \times 10^{13}/cm^2 \pm 1 \times 1^{13}/cm^2$, 30 Kev±2 Kev*

* Implant energy is dependent upon the screen oxide thickness Junction depth: ≈0.06 μm±0.02 μm Word line voltage $V_{WL}$: 3.75 Volts 0.2 Volts Substrate voltage $V_{sub}$: -1 Volt±0.5 Volt Boron concentration in the channel region: $1.5 \times 10^{17}/cm^3$ to $5 \times 10^{17}/cm^3$ with a target of $2.7 \times 10^{17}/cm^3$.

If the gate length L is scaled to 0.25 μm±0.05 μm then the pass transistor can be designed with a boron pocket implant of $10^{13}/cm^2 \pm 2 \times 10^{12}/cm^2$ and with all of the remaining above parameters, except that the $V_t$-adjust dose may be reduced to $1.5 \times 10^{12}/cm^2 \pm 0.5 \times 10^{12}/cm^2$ or eliminated and the substrate voltage $V_{sub}$ may be more negative: -1.5 volt±0.5 volt.

We claim:

1. A dynamic random access memory device formed in a substrate with a one transistor cell pass transistor having source and drain implant regions on either side of a channel region in the substrate and a gate overlying and separated from the channel region by a dielectric, the pass transistor comprising a patterned gate length L of about 0.3 μm, a dielectric thickness of about 85 Å, the source and drain being lightly doped with arsenic, the gate carrying a wordline voltage of about 3.75 volts, the substrate being biased at about -1 volts and a boron concentration in the channel region of about $2.7 \times 10^{17}/cm^3$.

2. A dynamic random access memory device formed in a substrate with a one transistor cell pass transistor having source and drain implant regions on either side of a channel region in the substrate and a gate overlying and separated from the channel region by a dielectric, the pass transistor comprising a patterned gate length L of 0.3 μm±0.08 μm, a gate dielectric thickness of 85 Å±5 Å, the source and drain being lightly doped with arsenic at a dose of $4.0 \times 10^{13}/cm^2 \pm 1 \times 10^{13}/cm^2$, the gate carrying a wordline voltage of 3.75 volts ±0.2 volt, the source and drain regions having a depth in the substrate of 0.06 μm±0.02 μm, the substrate containing boron in the channel region at a concentration of from $1.5 \times 10^{17}/cm^3$ to $5 \times 10^{17}/cm^3$ and the substrate being biased at -1 volt±0.5 volt.

3. A dynamic random access memory device formed in a substrate with a one transistor cell pass transistor having source and drain implant regions on either side of a channel region in the substrate and a gate overlying and separated from the channel region by a dielectric, the pass transistor comprising a patterned gate length L of about 0.25 μm, a dielectric thickness of about 85 Å, the source and drain being lightly doped with arsenic, the gate carrying a wordline voltage of about 3.75 volts, there being a boron pocket implant near the source and drain occurring at an implant angle of a certain degree, there being a boron concentration in the channel region of about $10^{17}/cm^3$ not counting the contribution from the boron pocket implant and the substrate being biased at about $-1.5$ volts.

4. The device of claim 3 in which the implant angle is zero degrees.

5. The device of claim 3 in which the gate length L is 0.25 µm±0.05 µm.

6. The device of claim 3 in which the boron pocket implant is $10^{13}/cm^2 \pm 2 \times 10^{12}/cm^2$.

7. The device of claim 3 in which there is no boron $V_t$-adjust dose.

8. A dynamic random access memory device formed in a substrate with a one transistor cell pass transistor having source and drain implant regions on either side of a channel region in the substrate and a gate overlying and separated from the channel region by a dielectric, the pass transistor comprising a patterned gate length L of about 0.3 µm, a dielectric thickness of about 85 Å, the source and drain being lightly doped with an N-type dopant, the gate carrying a wordline voltage greater than the supply voltage, the substrate being biased at a negative voltage and a P-type dopant concentration in the channel region of about $1.5 \times 10^{17}/cm^3$ to $5 \times 10^{17}/cm^3$.

9. The device of claim 8 in which the N-type dopant is arsenic.

10. The device of claim 8 in which the wordline voltage is about 1.5 times the supply voltage.

11. The device of claim 8 in which the substrate is biased at about $-1$ volts.

12. The device of claim 8 in which the P-type dopant is boron with a concentration in the channel region of about $2.7 \times 10^{17}/cm^3$.

13. The device of claim 8 in which $V_D$ is about 2.5 volts.

* * * * *